United States Patent

Nonaka

[11] Patent Number: 6,012,509
[45] Date of Patent: Jan. 11, 2000

[54] MECHANISM AND METHOD FOR HOLDING A SUBSTRATE ON A SUBSTRATE STAGE OF A SUBSTRATE TREATMENT APPARATUS

[75] Inventor: Hideyuki Nonaka, Yamanashi-ken, Japan

[73] Assignee: Tokyo Electron Limited, Japan

[21] Appl. No.: 08/865,771

[22] Filed: May 30, 1997

[30] Foreign Application Priority Data

Jun. 4, 1996 [JP] Japan .................................. 8-165320

[51] Int. Cl.⁷ ....................................................... F28F 7/00
[52] U.S. Cl. ........................... 165/80.2; 269/21; 269/903; 118/728
[58] Field of Search ................................. 165/80.1, 80.2, 165/80.4, 80.5, 185; 269/21, 903; 118/728

[56] References Cited

U.S. PATENT DOCUMENTS

| | | | |
|---|---|---|---|
| 4,139,051 | 2/1979 | Jones et al. | 165/80.1 |
| 4,535,834 | 8/1985 | Turner | 165/80.2 |
| 4,903,754 | 2/1990 | Hirscher et al. | 165/80.1 X |
| 5,131,460 | 7/1992 | Krueger | 165/80.2 |
| 5,177,878 | 1/1993 | Visser | 165/80.1 X |
| 5,191,218 | 3/1993 | Mori et al. | 269/21 X |
| 5,509,464 | 4/1996 | Turner et al. | |
| 5,542,559 | 8/1996 | Kawakami et al. | 118/728 X |
| 5,778,968 | 7/1998 | Hendrickson et al. | 165/80.1 |

FOREIGN PATENT DOCUMENTS

| | | | |
|---|---|---|---|
| 73724 | 3/1989 | Japan | 269/21 |
| 121361 | 5/1993 | Japan . | |

Primary Examiner—Leonard Leo
Attorney, Agent, or Firm—Graham & James LLP

[57] ABSTRACT

A mechanism for holding a substrate on a substrate stage of a substrate treatment apparatus according to the present invention comprises an exhaust mechanism section connected to the substrate treatment apparatus having the substrate stage therein and used to discharge a gas from the substrate treatment apparatus by suction, and a holding mechanism section having one end portion formed with a plurality of intake holes opening in the upper surface of the substrate stage on which the substrate is placed and the other end portion connected to the exhaust mechanism section, whereby the sucking force of the exhaust mechanism section is caused to act on the intake holes so that the substrate is held on the substrate stage by suction. A method for holding a substrate on a substrate stage of a substrate treatment apparatus according to the invention comprises steps of keeping the pressure in the substrate treatment apparatus at a predetermined vacuum pressure while discharging a gas from the substrate treatment apparatus having a substrate stage therein by suction, causing a sucking force for discharging the gas from the substrate treatment apparatus to act on a plurality of intake holes opening in a bearing surface of the substrate stage on which the substrate is to be placed, and placing the substrate on the bearing surface of the substrate stage on which the sucking force acts through the intake holes, thereby holding the whole area of the substrate on the bearing surface of the substrate stage.

3 Claims, 3 Drawing Sheets

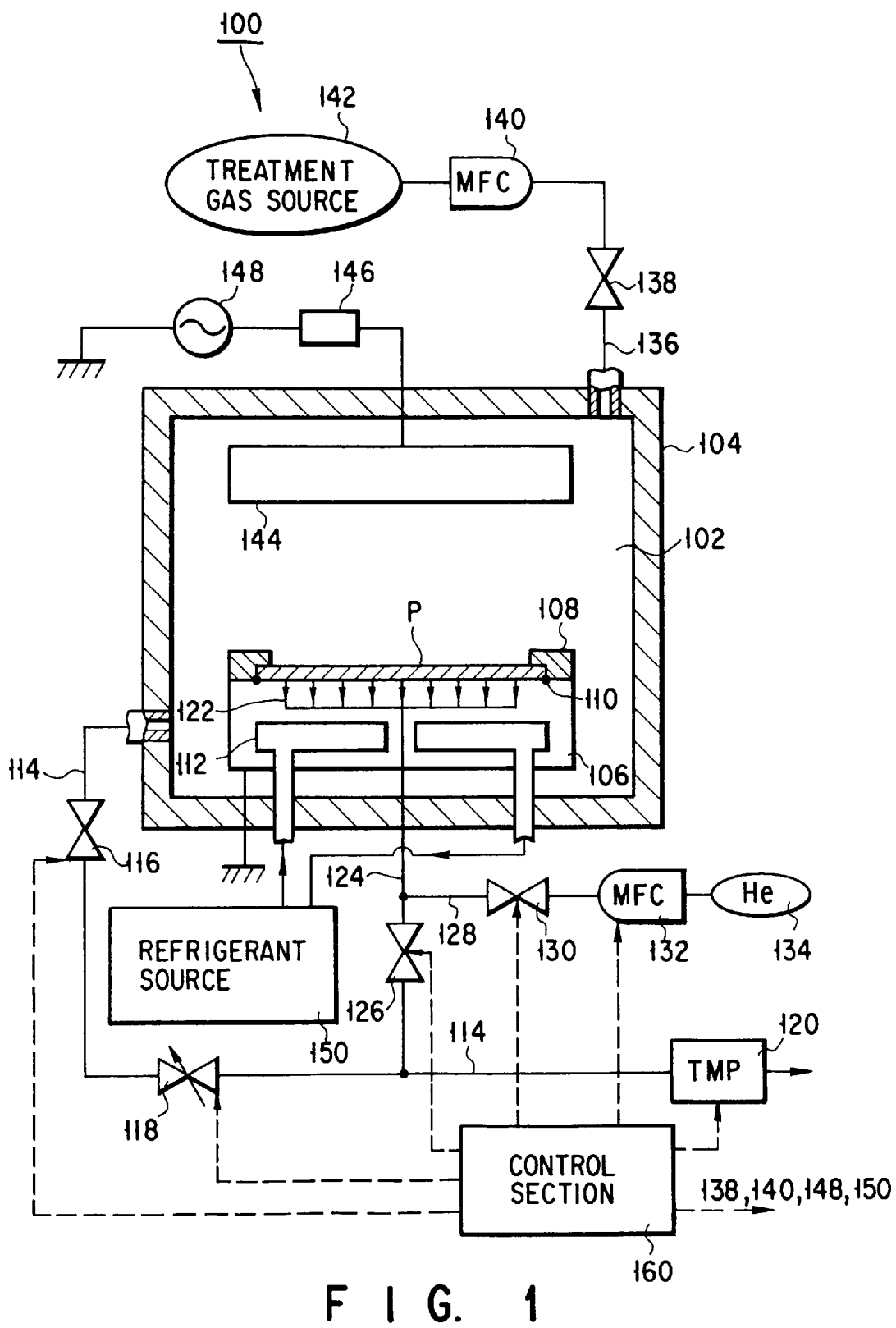
F I G. 1

MECHANISM AND METHOD FOR HOLDING A SUBSTRATE ON A SUBSTRATE STAGE OF A SUBSTRATE TREATMENT APPARATUS

BACKGROUND OF THE INVENTION

The present invention relates to a mechanism and method for holding a substrate, such as a liquid crystal display (hereinafter referred to as "LCD") substrate or semiconductor wafer, on a substrate stage (susceptor, etc.) in a substrate treatment apparatus for subjecting the substrate to treatments, such as film deposition, etching, ashing, etc.

Plasma treatment apparatuses are frequently used to manufacture semiconductor products and the like that have recently been becoming higher in density and finer. These apparatuses carry out film deposition, etching, ashing, and other treatments with use of plasma. It is feared, however, that the etching, ashing, or device characteristics of the plasma treatment apparatuses of this type are adversely affected by heat that is produced as the plasma is generated. In etching or ashing a to-be-treated film, such as a semiconductor film, metal film, or resist film, on an LCD substrate with use of plasma, in a process for manufacturing an active-matrix LCD, for example, the etching, ashing, or device characteristics may possibly receive bad influences from the heat attributable to the plasma generation or heat that is produced by a chemical reaction between the plasma and the to-be-treated film.

In order to reduce these bad influences of heat, an attempt has recently been made to improve the rate of heat transfer between the substrate and the substrate stage through the medium of helium gas so that heat can be efficiently released from the substrate and transferred to the substrate stage that has a cooling function.

FIG. 4 shows a conventional parallel-plate plasma etching apparatus 10. As shown in FIG. 4, the apparatus 10 comprises a treatment vessel 24 that forms a treatment chamber 12. The chamber 12 contains therein a substrate stage 14 as a lower electrode, on which an LCD substrate P, for example, is placed, and an upper electrode 16 that faces the stage 14 from above. A high-frequency power source 28 is connected to the upper electrode 16 through a matching device 26, whereby high-frequency power is applied to the electrode 16 so that plasma is generated between the electrode 16 and the substrate stage 14 as the lower electrode.

A refrigerant circuit 18 for use as temperature regulating means is provided inside the substrate stage 14. The stage 14 can be kept at a given temperature by circulating a refrigerant from a refrigerant source (not shown) through the refrigerant circuit 18. A clamp 30 is provided on the upper surface of the substrate stage 14. The clamp 30 presses the peripheral edge portion of the LCD substrate P on the stage 14, thereby mechanically holding the substrate P on the stage 14. The substrate stage 14 is provided with a large number of gas supply holes 34 opening in its upper surface that carries the LCD substrate P thereon. The holes 34 are connected to a gas supply pipe 32, which is connected to a helium gas source (not shown).

An exhaust pipe 22, which is connected to a vacuum pump (not shown), is attached to the lower part of a side wall of the treatment vessel 24, whereby the treatment chamber 12 can be evacuated to a predetermined vacuum pressure. A top wall of the vessel 24 is provided with a gas inlet pipe 20 through which a specified treatment gas is introduced into the chamber 12.

In the plasma etching apparatus 10 constructed in this manner, the specified treatment gas is introduced into the treatment chamber 12 through the gas inlet pipe 20 after the LCD substrate P is placed on the substrate stage 14. At this time, the chamber 12 is evacuated through the exhaust pipe 22, whereupon it is kept at the predetermined vacuum pressure. In this state, the high-frequency power from the high-frequency power source 28 is applied to the upper electrode 16 through the matching device 26, so that plasma is generated between the electrode 16 and the substrate stage 14 as the lower electrode. Thus, the to-be-treated surface of the LCD substrate P is etched by the agency of radicals, ions, etc. that are produced when the plasma is generated.

During this etching process, the interior of the treatment chamber 12 is kept at a vacuum pressure of, for example, tens to hundreds of mTorr. If the LCD substrate P is simply placed on the substrate stage 14 under this low pressure, the adhesion between the substrate P and the stage 14 is too low to transfer the heat from the substrate P satisfactorily to the stage 14. As a result, the cooling function of the stage 14 cannot be fulfilled, so that the temperature of the substrate P inevitably increases to an excessive extent. In order to enhance the adhesion between the substrate P and the stage 14, thereby restraining the substrate temperature from rising, therefore, the peripheral edge portion of the substrate P is pressed against the stage 14 by means of the clamp 30, and helium gas at, for example, several Torr is introduced into the region between the substrate P and the stage 14 through the gas supply pipe 32 and the gas supply holes 34. The helium gas between the substrate P and the stage 14 improves the rate of heat transfer between the two, and allows the heat from the substrate P to transfer efficiently to the stage 14. Thus, the temperature of the LCD substrate P can be prevented from increasing excessively.

When placing a semiconductor wafer on the substrate stage 14, in general, the wafer is attracted electrostatically to the stage 14 by means of an electrostatic chuck that is capable of all-over attraction. When the LCD substrate P is placed on the stage 14, however, the electrostatic chuck cannot serve as holding means, since the substrate P is formed of electrically insulated glass. As mentioned before, therefore, the substrate P is mechanically held on the stage 14 in a manner such that its peripheral edge portion is pressed by means of the clamp 30. If helium gas at several Torr, for example, is introduced into the region between the substrate P and the stage 14 in this state, however, the central portion of the substrate P is urged upward by a pressure equivalent to the difference between the pressure from the helium gas, which acts on the inner surface of the substrate P, and the pressure (tens to hundreds of mTorr) in the treatment chamber 12, which acts on the outer surface of the substrate. Thereupon, the central portion of the substrate P swells and separates from the stage 14. Even though the helium gas is introduced expressly to improve the rate of heat transfer between the substrate P and the stage 14, therefore, heat transfer at the central portion of the substrate P is not satisfactory, so that the temperature of the substrate P cannot be restrained from rising. If the LCD substrate P has a substantial thickness (e.g., about 1.1 mm), in this case, its deflection attributable to the differential pressure is so small that the problem of heat transfer failure exerts no bad influences on plasma treatment. If the substrate P is relatively thin (e.g., about 0.7 mm thick), however, the differential pressure causes it to bend substantially, so that the rate of heat transfer at the central portion of the substrate P is worsened. Thus, there is a possibility of the etching characteristics being adversely affected. This arouses a serious problem in these days of development of thinner, larger LCD substrates. Naturally, the substrate stage 14 may be shaped in consideration of the deflection of the LCD substrate P. If this is done, however, the treatment accuracy and costs involve problems, and it is very difficult to put this substrate stage to practical use.

BRIEF SUMMARY OF THE INVENTION

The object of the present invention is to provide a mechanism and method for holding a substrate on a substrate stage of a substrate treatment apparatus, capable of enhancing the adhesion between the substrate and the substrate stage, thereby improving the rate of heat transfer between them, without regard to the pressure in the treatment apparatus or the material of the substrate.

The above object of the invention is achieved by a mechanism for holding a substrate on a substrate stage of a substrate treatment apparatus, which comprises: exhaust means connected to the substrate treatment apparatus having the substrate stage therein and used to discharge a gas from the substrate treatment apparatus by suction; and holding means having one end portion formed with a plurality of suction holes opening in the upper surface of the substrate stage on which the substrate is placed and the other end portion connected to the exhaust means, whereby the sucking force of the exhaust means is caused to act on the suction holes so that the substrate is held on the substrate stage by suction.

Further, the above object of the invention is achieved by a method for holding a substrate on a substrate stage of a substrate treatment apparatus, which comprises steps of: keeping the pressure in the substrate treatment apparatus at a predetermined vacuum pressure while discharging a gas from the substrate treatment apparatus having a substrate stage therein by suction; causing a sucking force for discharging the gas from the substrate treatment apparatus to act on a plurality of suction holes opening in a bearing surface of the substrate stage on which the substrate is to be placed; and placing the substrate on the bearing surface of the substrate stage on which the sucking force acts through the suction holes, thereby holding the whole area of the substrate on the bearing surface of the substrate stage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

FIG. 1 is a diagram showing a plasma etching apparatus furnished with a mechanism according to an embodiment of the present invention;

DETAILED DESCRIPTION OF THE INVENTION

Figure 2:
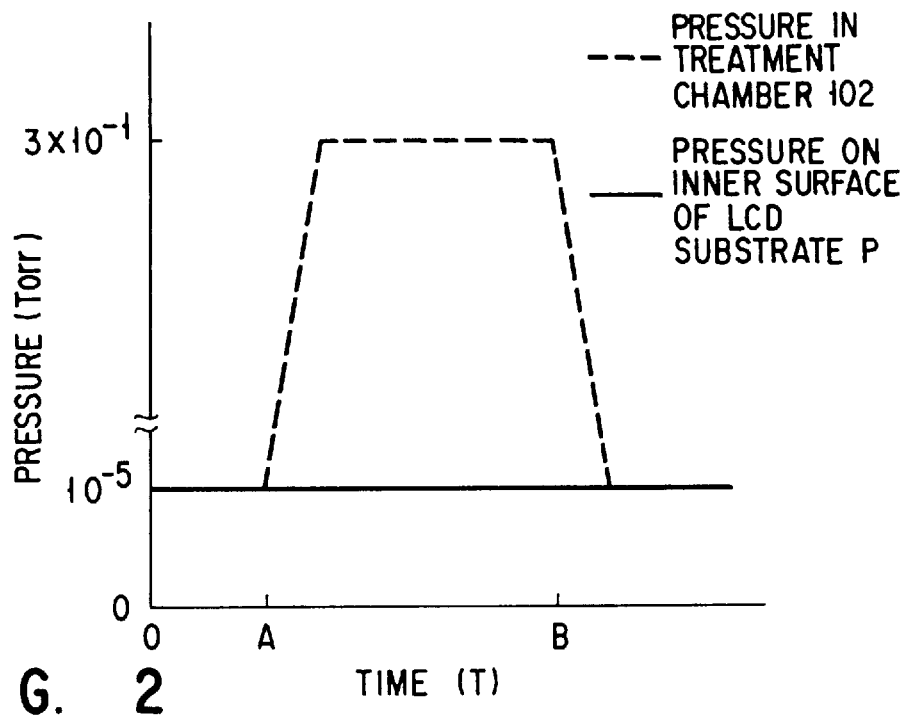
FIG. 2 is a graph showing time-based changes of pressure in a treatment chamber and pressure acting on the inner surface of an LCD substrate during an etching process using the apparatus of FIG. 1.

An embodiment of the present invention will now be described with reference to the accompanying drawings.

FIG. 1 shows a parallel-plate plasma etching apparatus 100 for use as a substrate treatment apparatus. As shown in FIG. 1, the apparatus 100 comprises a treatment vessel 104 that forms a treatment chamber 102. The vessel 104 is formed of an electrically conductive material, e.g., aluminum treated with Alumite, and has an airtight structure such that the treatment chamber 102 can be opened and closed. The treatment vessel 104 contains therein a substrate stage (or susceptor) 106 as a lower electrode, on which an LCD substrate P is placed, and an upper electrode 144 that faces the stage 106 from above. The substrate stage 106 and the upper electrode 144 are formed of aluminum treated with Alumite, for example. A high-frequency power source 148 is connected to the upper electrode 144 through a matching device 146, whereby high-frequency power is applied to the electrode 144 so that plasma is generated between the electrode 144 and the substrate stage 106 as the lower electrode.

Push pins (not shown) for pushing up the LCD substrate P are arranged on the upper surface of the substrate stage 106 so as to be projectable. A refrigerant circuit 112 as temperature regulating means, which is connected to a refrigerant source 150, is provided inside the stage 106. Thus, the stage 106 can be kept at a given temperature (e.g., 25° C.) by circulating a refrigerant from the refrigerant source 150 through the refrigerant circuit 112. The temperature control of the substrate stage 106 with use of the refrigerant is effected automatically by means of a control section 160 that includes a temperature sensor (not shown) and a temperature regulating mechanism (not shown).

A ceramic-shielded clamp 108 is provided on the upper surface of the substrate stage 106. The clamp 108 presses the peripheral edge portion of the LCD substrate P on the stage 106, thereby mechanically holding the substrate P on the stage 106. Further, an O-ring 110 is provided on that part of the upper surface of the stage 106 which carries the peripheral edge portion of the substrate P thereon. When the peripheral edge portion of the LCD substrate P is pressed against the O-ring 110 by the clamp 108, the ring 110 is squeezed by the peripheral edge portion of the substrate P, thereby supplementing the retaining force of the clamp 108 and enhancing the adhesion between the stage 106 and the substrate P.

An exhaust pipe 114, which is connected to a turbo molecular pump (TMP) 120, is attached to the lower part of a side wall of the treatment vessel 104, whereby the treatment chamber 102 can be evacuated to a predetermined vacuum pressure. A valve 116 and a pressure regulating valve 118 are inserted in the middle of the pipe 114. According to the present embodiment, the respective operations of the valves 116 and 118 and the pump 120 are controlled by means of the control section 160 that includes a pressure sensor (not shown) and a pressure regulating mechanism (not shown), in order to keep the internal pressure of the treatment chamber 102 at, for example, $10^{-5}$ Torr.

A top wall of the treatment vessel 104 is provided with a gas inlet pipe 136 through which a specified treatment gas is introduced into the treatment chamber 102. More specifically, the pipe 136 is connected to a treatment gas source 142, which is loaded with, for example, a gas mixture of chlorine and oxygen, through a valve 138 and a mass flow controller (MFC) 140.

The substrate stage 106 is provided with a large number of gas intake holes 122 opening in its upper surface that carries the LCD substrate P thereon. The holes 122 are connected, by means of a suction pipe 124, to that part of the exhaust pipe 114 which is situated on the downstream side of the pressure regulating valve 118. A valve 126 is inserted in the middle of the pipe 124, and its open-close operation is controlled by means of the control section 160. Further, a gas inlet pipe 128 is connected to that part of the suction pipe 124 which is situated on the upstream side of the valve 126. The pipe 128 is connected to a gas source 134, which is loaded with, for example, helium gas, through a valve 130 and a mass flow controller (MFC) 132. The respective operations of the valve 130 and the mass flow controller 132 are controlled by means of the control section 160. Also, the respective operations of the valve 138, mass flow controller 140, and high-frequency power source 148 are controlled by means of the control section 160.

The following is a description of a case in which a chromium film on the LCD substrate P is etched by means of the plasma etching apparatus 100 constructed in the aforementioned manner.

Before starting the etching process, only the valves 116 and 126 and the pressure regulating valve 118 are first opened, the turbo molecular pump 120 is actuated, and the inside of the treatment chamber 102 is kept at a vacuum pressure of $10^{-5}$ Torr, for example. In this state, the LCD substrate P is carried into the treatment vessel 104 by means of transportation means (not shown), and is placed on the substrate stage 106, the lower electrode. Thereafter, the peripheral edge portion of the substrate P is pressed by the clamp 108, whereupon the substrate P is mechanically held on the stage 106. At this time, a pressure of $10^{-5}$ Torr, which is equal to the internal pressure of the treatment chamber 102, is caused to act on the inner surface of the substrate P by the effect of suction of the molecular pump 120 through the suction pipe 124.

Figure 4:
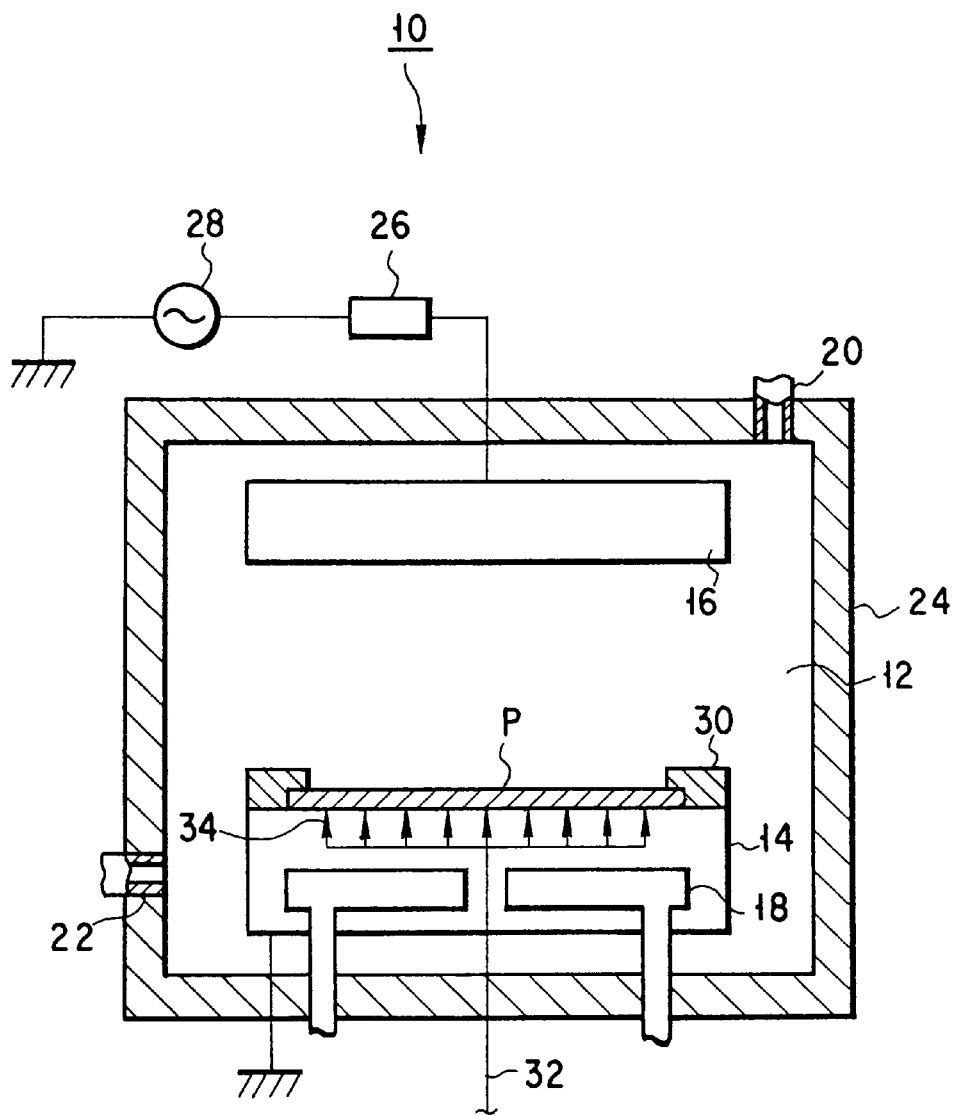
FIG. 4 is a diagram schematically showing a conventional plasma etching apparatus.

Then, the valve 138 is opened, and the treatment gas (gas mixture of chlorine and oxygen), which is controlled in flow by means of the mass flow controller 140, is introduced from the treatment gas source 142 into the treatment chamber 102 through the gas inlet pipe 136. FIG. 2 shows change of pressure in the chamber 102 that is caused as the gas is introduced in this manner. In FIG. 2, symbol A indicates the time for the start of the introduction of the treatment gas into the chamber 102. The pressure in the treatment chamber 102 increases to, for example, 300 mTorr ($3 \times 10^{-1}$ Torr), during the introduction of the gas, and is kept at this value, thereafter, as shown in FIG. 2. On the other hand, the pressure acting on the inner surface of the LCD substrate P continues to be kept at $10^{-5}$ Torr by the effect of suction of the turbo molecular pump 120. Accordingly, the substrate P is subjected to a downward force attributable to the pressure in the chamber 102 (more exactly, the difference between the pressure in the chamber 102 acting on the outer surface of the substrate P and the pressure acting on the inner surface of the substrate), whereby it is caused to adhere to the substrate stage 106. Naturally, this force of adhesion is supplemented by the urging force of the clamp 108 and deformation of the O-ring 110. Thus, the substrate P, unlike the conventional example shown in FIG. 4, is forced downward without receiving any upward force from helium gas, so that its whole area can be firmly held on the upper surface of the stage 106 by suction without deflection.

The force F (downward force acting on the outer surface of the LCD substrate P) of adhesion of the substrate P against the substrate stage 106 can be specifically expressed as follows (the difference between the pressures acting on the outer and inner surfaces of the substrate P is substantially equal to the processing pressure (300 mTorr)):

$$F = 1{,}033 \text{ gf/cm}^2 \times (300 \times 10^{-3} \text{ Torr})/(760 \text{ Torr}) \times 37 \text{ cm} \times 47 \text{ cm} = 710 \text{ gf,}$$

in the case where the substrate P measures 370 mm by 470 mm, or $$F = 1{,}033 \text{ gf/cm}^2 \times (300 \times 10^{-3} \text{ Torr})/(760 \text{ Torr}) \times 55 \text{ cm} \times 65 \text{ cm} = 1{,}459 \text{ gf,}$$

in the case where the substrate P measures 550 mm by 650 mm.

After the whole area of the LCD substrate P is held on the substrate stage 106 in this manner, high-frequency power from the high-frequency power source 148 is applied to the upper electrode 144 through the matching device 146. Thereupon, plasma is formed between the electrode 144 and the stage 106, and the chromium film on the substrate P is etched with radicals, ions, etc. that are generated as the treatment gas dissociates.

During this etching process, the whole area of the LCD substrate P adheres to the substrate stage 106, so that the rate of heat transfer between the substrate P and the stage 106 is increased. Therefore, heat generated in the chromium film on the substrate P can be efficiently transmitted to and radiated from the stage 106 that is kept at the given temperature (e.g., 25° C.) by means of the refrigerant flowing through the refrigerant circuit 112. Thus, a rise in temperature of the substrate P can be restrained.

Figure 3:
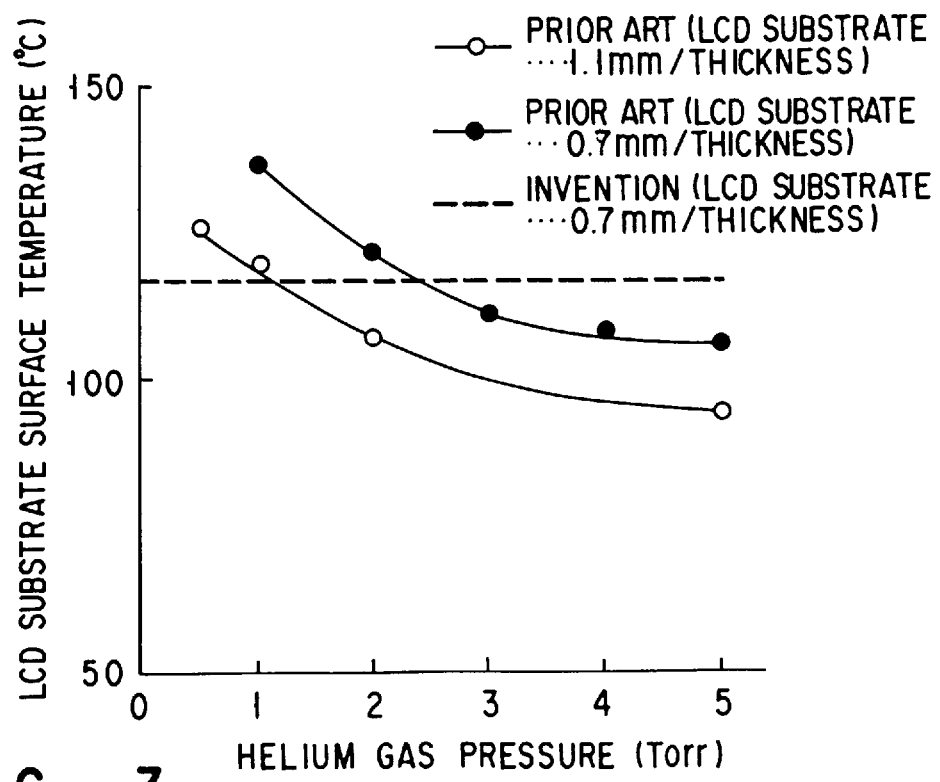
FIG. 3 is a graph showing relations between helium gas pressure and the surface temperature of the LCD substrate.

FIG. 3 is a graph showing relations between the helium gas pressure and the surface temperature of the LCD substrate P. According to the conventional method in which the helium gas is caused to act on the inner surface of the substrate P, as shown in FIG. 3, the surface temperature of the substrate P lowers as the helium gas pressure increases. As the thickness of the substrate P decreases, however, the deflection of the substrate increases, and the degree of adhesion between the substrate and the substrate stage lowers, so that the cooling effect is reduced. For example, an LCD substrate of 0.7-mm thickness bends to a higher degree than one 1.1 mm thick, and its surface temperature lowers at a lower rate. On the other hand, the LCD substrate P never bends according to the method of the present embodiment (invention) in which the LCD substrate P is held on the substrate stage 106 by suction without the introduction of the helium gas. Accordingly, the substrate P of 0.7 mm-thickness, compared with the conventional one, can enjoy substantially the same cooling effect as when the helium gas pressure is at 2 Torr or more and improved etching characteristics.

When the etching process is completed, the valve 138 is closed, and the treatment gas ceases to be introduced into the treatment chamber 102. After the passage of a given time, the pressure in the chamber 102 becomes equal to the pressure that acts on the inner surface of the LCD substrate P. Thus, by the effect of suction of the turbo molecular pump 120 that continues to operate, the pressure in the chamber 102 is reduced to $10^{-5}$ Torr, which is equal to the pressure acting on the inner surface of the substrate P. In order to carry out the substrate P from, for example, the treatment chamber 102 in this state, the push pins (not shown) are actuated, so that the substrate P is pushed up above the substrate stage 106. Naturally, in this case, the difference in pressure between the opposite surfaces of the substrate P, having been caused during the etching process, is already removed, so that the substrate P can be easily pushed up by means of the push pins.

Immediately after the valve 138 is closed on completion of the etching process, the pressure in the treatment chamber 102 is not equal to the pressure that acts on the inner surface of the LCD substrate P (see FIG. 2), that is, the differential pressure remains between the opposite surfaces of the substrate P. If the push pins are actuated at this point of time, therefore, the substrate P cannot be easily pushed up above the substrate stage 106. In pushing up the substrate P without waiting for the pressure in the chamber 102 to become equal to the pressure acting on the inner surface of the substrate, therefore, the valve 130 is opened with the valve 126 closed, whereupon the helium gas from the gas source 134 is guided to the inner surface of the substrate P through the suction pipe 124 and the gas intake holes 122. As a result, the difference in pressure between the opposite surfaces of the substrate P is removed, so that the substrate P can be easily pushed up by means of the push pins. This method is effective in improving the throughput.

In the plasma etching apparatus 100 according to the present embodiment, as described above, the gas intake holes 122 opening in the upper surface of the substrate stage 106, which carries the LCD substrate P thereon, are connected to the exhaust pipe 114 on which acts the sucking force of the turbo molecular pump 120. Thus, the pressure that acts on the inner surface of the substrate P can be set to be lower than the pressure in the treatment chamber 102 (that acts on the outer surface of the substrate P) produced during the introduction of the treatment gas, and the whole area of the substrate P can be caused to adhere to the substrate stage 106 under the differential pressure. This force of adhesion is enhanced by the urging force of the clamp 108 and deformation of the O-ring 110. Thus, the substrate P, unlike the conventional example, is forced downward without receiving any upward force from the helium gas, so that its whole area can be firmly held on the upper surface of the stage 106 by suction without deflection. As a result, the rate of heat transfer between the substrate P and the stage 106 is increased, so that the heat of the substrate P generated during plasma treatment can be efficiently transmitted to and radiated from the stage 106 that is kept at the given temperature by means of the refrigerant flowing through the refrigerant circuit 112. Accordingly, a rise in temperature of the substrate P can be restrained. If the whole area of the LCD substrate P is thus held on the substrate stage 106 by means of the sucking force, the substrate P can be caused to adhere to the stage 106 without deflection, thereby ensuring a satisfactory heat radiation effect and good etching characteristics, even though the substrate is large-sized or reduced in thickness.

In the plasma etching apparatus 100 according to the present embodiment, moreover, the pressure in the treatment chamber 102 and the pressure acting on the inner surface of the LCD substrate P become equal without suspending the operation of the turbo molecular pump 120, only if the introduction of the treatment gas is stopped. At any other time than during the etching process, therefore, the substrate P can be easily pushed up by means of the push pins, so that the throughput can be improved. Even in the case where the pressure in the treatment chamber 102 and the pressure acting on the inner surface of the substrate P are not equal, in particular, the difference in pressure between the opposite surfaces of the substrate P can be removed by guiding the helium gas from the gas source 134 to the inner surface of the substrate P through the suction pipe 124 and the gas intake holes 122. Thus, the substrate P can be pushed up with ease, so that the throughput can be improved further.

In the plasma etching apparatus 100 according to the present embodiment, furthermore, the helium gas can be guided to the inner surface of the LCD substrate P, so that it can ensure the effect of the conventional example shown in FIG. 4, and the aforesaid adhesion performance can be obtained without substantially modifying the arrangement of FIG. 4.

Although the LCD substrate P has been described as an example of a substrate according to the present embodiment, it may be replaced with a semiconductor wafer or glass substrate. According to this embodiment, moreover, the plasma etching apparatus is taken as an example of a substrate treatment apparatus. However, the apparatus may be any other treatment apparatus, such as an ECR, inductive-coupling plasma etching apparatus, or ashing apparatus, that includes a substrate stage constructed in the aforesaid manner. According to the embodiment described herein, furthermore, a satisfactory force of adhesion can be obtained by the effect of suction, so that the clamp 108 and the O-ring 110 are not indispensable.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method for holding a substrate formed of electrical insulating glass and having a peripheral edge portion on a substrate stage of a substrate treatment apparatus, the substrate stage having an upper bearing surface having a plurality of intake holes and an O-ring on the portion of the upper bearing surface which receives the peripheral edge portion of the substrate, comprising the steps of:

keeping the substrate treatment apparatus at a predetermined vacuum pressure while discharging a gas from the substrate treatment apparatus by suction;

causing a suction force for discharging the gas from the substrate treatment apparatus to act on the plurality of intake holes in the bearing surface of the substrate stage on which the substrate is to be placed; and placing the substrate on the bearing surface of the substrate stage on which the suction force acts through the intake holes, and pressing the peripheral edge portion of said substrate against the O-ring on the bearing surface of the substrate stage by a clamp, thereby holding the whole area of the substrate on the bearing surface of the substrate stage and enhancing the adhesion between the substrate and substrate stage.

2. A method for holding a substrate on a substrate stage of a substrate treatment apparatus according to claim 1, wherein said substrate is held on the bearing surface of the substrate stage by suction attributable to the difference between the pressure in the substrate treatment apparatus acting on the outer surface of the substrate and a pressure acting on the inner surface of the substrate through the intake holes.

3. A method for holding a substrate on a susbstrate stage of a subsrate treatment apparatus according to claim 2, further comprising a step of reducing the difference between the pressures on the outer end inner surfaces of the substrate by causing a pressure from an inert gas to act on the inner surface of the substrate.

* * * * *